United States Patent
Fabrie et al.

(10) Patent No.: US 10,534,396 B2
(45) Date of Patent: Jan. 14, 2020

(54) METHOD, AND A SYNCHRONOUS DIGITAL CIRCUIT, FOR PREVENTING PROPAGATION OF SET-UP TIMING DATA ERRORS

(71) Applicant: NXP B.V., Eindhoven (NL)

(72) Inventors: Sebastien Fabrie, Eindhoven (NL); Juan Echeverri Escobar, Vedhoven (NL); Jose Pineda De Gyvez, Eindhoven (NL)

(73) Assignee: NXP USA, Inc., Austin, TX (US)

( * ) Notice: Subject to any disclaimer, the term of this patent is extended or adjusted under 35 U.S.C. 154(b) by 11 days.

(21) Appl. No.: 15/911,901

(22) Filed: Mar. 5, 2018

(65) Prior Publication Data
US 2018/0224886 A1   Aug. 9, 2018

(30) Foreign Application Priority Data

Feb. 9, 2017   (EP) .................................... 17155429

(51) Int. Cl.
*G06F 1/12* (2006.01)
*G06F 11/16* (2006.01)
*H04L 7/00* (2006.01)
*G01R 31/317* (2006.01)
*G06F 11/00* (2006.01)

(52) U.S. Cl.
CPC ......... *G06F 1/12* (2013.01); *G01R 31/31726* (2013.01); *G06F 11/1604* (2013.01); *H04L 7/0054* (2013.01)

(58) Field of Classification Search
None
See application file for complete search history.

(56) References Cited

U.S. PATENT DOCUMENTS

| 7,385,861 B1* | 6/2008 | Zhu ..................... G06F 13/4243 |
| | | 365/194 |
| 8,836,379 B2 | 9/2014 | Guntur et al. |
| 2011/0107166 A1 | 5/2011 | Flautner et al. |
| 2012/0068749 A1 | 3/2012 | Sood et al. |

(Continued)

OTHER PUBLICATIONS

B. Amrutur, et. al. "Adaptive Techniques to Reduce Power in Digital Circuits," DOI:10.3390/jlpea1020261; Journal of Low Power Electronics and Applications, Basel, Switzerland, Jul. 2011.

(Continued)

*Primary Examiner* — Justin R Knapp

(57) ABSTRACT

There is disclosed a synchronous digital circuit having a system clock and for processing a data signal, wherein the digital circuit comprises a data path, a hard macro having a macro input, a logic circuit in the data path upstream of the macro input and having a first part and a second part, the second part being immediately upstream of the macro input, a set-up timing error detector having an input, wherein the input is on the data path between the first part and the second part, and a timing correction unit, wherein the data transit time across the second part is equal to or less than one half of a clock period, and wherein the timing correction unit is configured to correct, in response to the set-up timing error detector detecting a set-up timing error, the detected set-up timing error before the data reaches the macro input.

15 Claims, 9 Drawing Sheets

(56) References Cited

U.S. PATENT DOCUMENTS

| | | | | |
|---|---|---|---|---|
| 2012/0210286 A1* | 8/2012 | Abdelhamid | ......... | G06F 17/505 716/113 |
| 2016/0109901 A1* | 4/2016 | Sheafor | .................... | G06F 1/06 713/400 |
| 2017/0184664 A1* | 6/2017 | Nicolaidis | .......... | G01R 31/3172 |

OTHER PUBLICATIONS

D. Ernst et.al. "Razor: Circuit-Level Correction of Timing Errors for Low-Power Operation," IEEE Micro, vol. 24, Issue 6, Dec. 2004, pp. 10-20.
K. Chae et. al. "A Dynamic Timing Control Technique Utilizing Time Borrowing and Clock Stretching," IEEE Custom Integrated Circuits Conference (CICC), San Jose, United states.
M. Choudhury et al.: "TIMBER: Time borrowing and error relaying for online timing error resilience", 2010 Design, Automation & Test in Europe Conference & Exhibition: Dresden, Germany Mar. 8-12, 2010, IEEE, Piscataway, NJ, USA, pp. 1554-1559, XP032317914.

\* cited by examiner

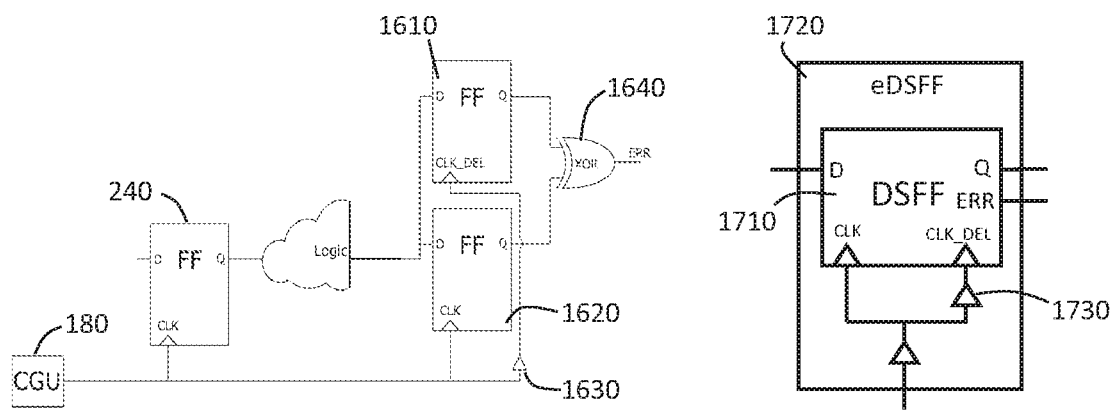
*Figure 16*        *Figure 17*

METHOD, AND A SYNCHRONOUS DIGITAL CIRCUIT, FOR PREVENTING PROPAGATION OF SET-UP TIMING DATA ERRORS

CROSS-REFERENCE TO RELATED APPLICATIONS

This application claims the priority under 35 U.S.C. § 119 of European Patent application no. 17155429.8, filed on 9 Feb. 2017, the contents of which are incorporated by reference herein.

FIELD

This disclosure relates to synchronous digital circuits, and to methods of avoiding set-up timing data errors in data propagating from logic to a hard macro, in such a synchronous digital circuit.

BACKGROUND

Synchronous digital circuits can be subject to set-up timing errors. A set-up timing error occurs when the circuit does not achieve a specific well-defined data state—either high or low—before the subsequent rising edge of the clock signal. Setup timing errors can occur due to several reasons, such as ageing, voltage scaling, frequency scaling, etc.

Set-up timing errors can be detected using, for example, double sampling flip-flops. Once an error is detected, it can generally be masked, for instance by "borrowing" time from a subsequent stage, in particular the next downstream pipeline stage, which is typically a further logic block. The error, thus masked, propagates through the logic without causing failures. However, in some architectures, this may not be possible, in particular in the presence of a hard macro. As will be described in more detail hereinbelow, in this disclosure, a hard macro, also known as hard core of hard IP, refers to a circuit element or block, at the input of which timing errors either cannot be tolerated, or are undetectable.

SUMMARY

According to one aspect of the present disclosure, there is provided a synchronous digital circuit having a system clock and for processing a data signal, wherein the digital circuit comprises: a data path; a hard macro having a macro input; a logic circuit in the data path upstream of the macro input and having a first part and a second part, the second part being immediately upstream of the macro input; a set-up timing error detector having an input, wherein the input is on the data path between the first part and the second part; and a timing correction unit: wherein—during normal operation—the data transit time across the second part is equal to or less than one half of a clock period, and wherein the timing correction unit is configured to correct, in response to the set-up timing error detector detecting a set-up timing error, the detected set-up timing error before the data reaches the macro input.

In one or more embodiments, the set-up timing error detector is in the data path and between the first part of the logic circuit and the second part of the logic circuit. In one or more other embodiments, the set-up timing detector is not in the data path, and in the data path the first part of the logic circuit is adjacent the second part of the logic circuit in the data path. Including the set-up timing error detector in the data path may be beneficial, since the overall flow is simplified; conversely, having the set-up timing error detector not in the data path may, for one or more embodiments, save some time: since letting the data traverse through the detector also involves passing it through some cells; this has the effect of slowing the data down. This doesn't happen when the data doesn't pass through the detector but instead the detector only samples the data and flags an error if needed.

In one or more embodiments, the timing error detector comprises a flag, configured to flag an error to the timing correction unit.

In one or more embodiments, the timing error detector comprises a double sampling flip-flop having a clock input which is an inverted system clock. In other embodiments, a similar circuit design is used instead of a DSFF, for instance a logical combination of latches may be used to achieve the same or similar result—in particular to detect and flag a later-than-expected data transition.

In one or more embodiments, the double sampling flip-flop further comprises a delayed clock input which is a delayed inverted system clock.

In one or more embodiments, the timing correction unit comprises a clock gating unit configured to gate the clock in response to detection of a set-up timing error. In one or more other embodiments, the timing correction unit comprises a clock stretcher configured to stretch the clock in response to detection of a set-up timing error. In such embodiments or other embodiments, the timing correction unit may form part of a clock generation unit for providing the system clock. In yet other embodiments, the timing correction unit comprises one of (a) a voltage adjustment unit configured to adjust a voltage of the synchronous digital circuit, so as to speed up the clock, and (b) a body biasing adjustment circuit configured to adapt the bias of the body of the synchronous digital circuit, in response to detection of a set-up timing error.

In one or more embodiments the hard macro is an SRAM. In other embodiments, the hard macro is a Graphics Processing Unit (GPU). Typically, but without limitation, the hard macro may be precompiled and such that the circuit designer cannot edit or synthesize it. In general, a hard macro, which may also be referred to as a hard core, is such that if an error propagates into it, the error is undetectable and unrecoverable. As used herein, a "hard" macro may be distinguished from a "soft macro": in the case of a soft macro, it is possible to detect and correct an error, which has propagated into the macro.

According to another aspect of the present disclosure there is provided an electronic component comprising a synchronous digital circuit as described above. The electronic component may be, for example, one of a microcontroller, a digital signal processor and a graphics processing unit.

According to another aspect of the present disclosure there is provided a method a preventing set-up timing data errors in data propagating from logic to a hard macro, the logic and hard macro both comprised in a synchronous digital circuit, the method comprising: detecting a set-up timing error, by means of a set-up timing error detector, within one half of a normal operation clock period prior to the data reaching the hard macro, and correcting, in response to detecting a set-up timing error, the detected set-up timing error before the data reaches the macro input.

In one or more embodiments, detecting a set-up timing error comprises double sampling the data by a double sampling flip-flop.

In one or more embodiments, correcting the detected set-up timing error comprises gating a system clock or stretching the system clock, and replacing the data by the second sample of the double sampling flip-flop. In one or more other embodiments, correcting the detected set-up timing error comprises adjusting an operating voltage of the synchronous digital circuit, and replacing the data by the second sample of the double sampling flip-flop: since the data has less time to travel through the second part of the logic, compensation is needed. This may be done by increasing the logic voltage (Vdd): that is to say, when an error is detected, the Vdd of the core logic should be increased, which allows the data to move faster through the logic. The clock period itself is not affected. Alternatively and without limitation, a biasing voltage may be applied to the bulk of the transistors in the logic cells, that is to say, 'forward body biasing' is used—which will also increase the speed of the data traveling through the logic.

These and other aspects will be apparent from, and elucidated with reference to, the embodiments described hereinafter.

BRIEF DESCRIPTION OF DRAWINGS

Embodiments will be described, by way of example only, with reference to the drawings, in which

FIG. 16 shows another implementation of a detector, and

FIG. 17 shows yet another implementation of a detector.

Figure 1:
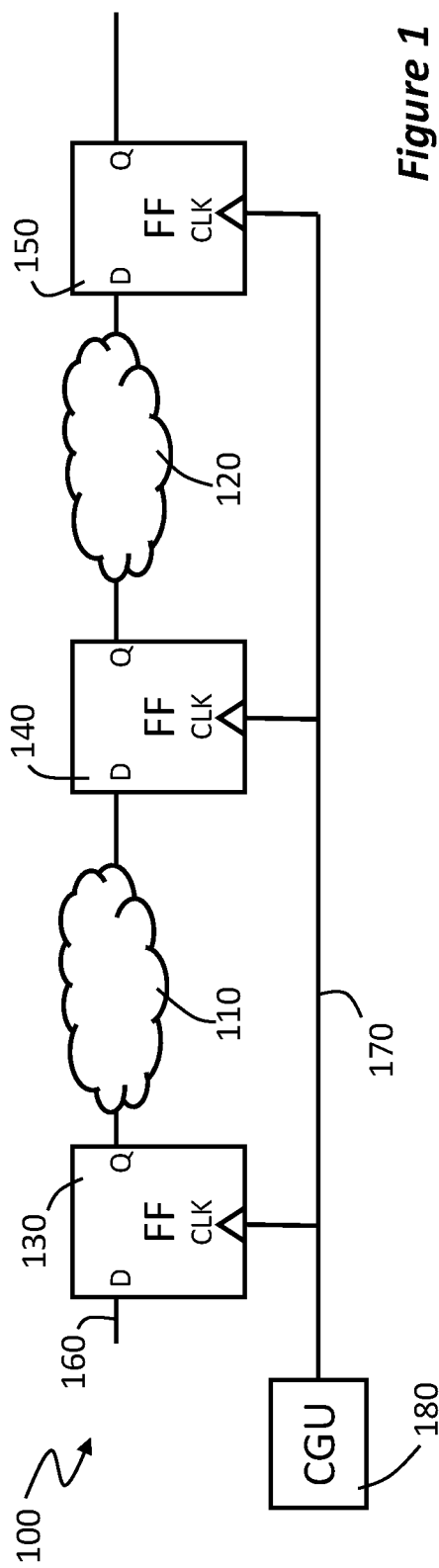
FIG. 1 shows a typical logic path in a synchronous design.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows a typical path in a synchronous digital design 100, having logic blocks 110 and 120, and including regular flip-flops 130, 140, and 150. The path includes a data signal 160 and a clock signal 170. The clock signal 170 is a system clock generated by a clock generation unit (CGU) 180, and supplied as the clock input CLK to each of the flip-flops. The system clock may be a local clock or may be a universal clock. The data output from each logic stage, also referred to as a pipeline stage, is input to the subsequent flip-flop at data input D, and the flip-flop latched output Q is supplied as input to the next logic stage.

Figure 2:
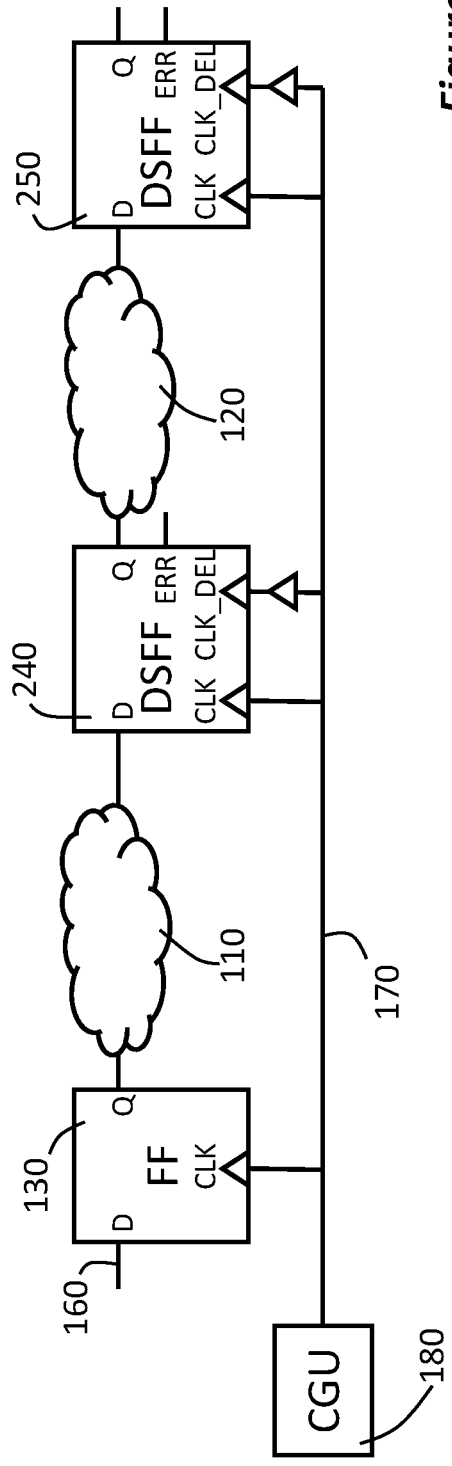
FIG. 2 shows a typical logic path in a synchronous design in which regular flip-flops are replaced with double sampling flip-flops (DSFFs)

FIG. 2 shows the same path 100 wherein the flip-flops 140 and 150 are replaced by double sampling flip-flops (DSFF) 240 and 250. DSFFs allow set-up timing errors to be detected, as will be described with reference to FIGS. 3 and 4.

Figures 3, 4:
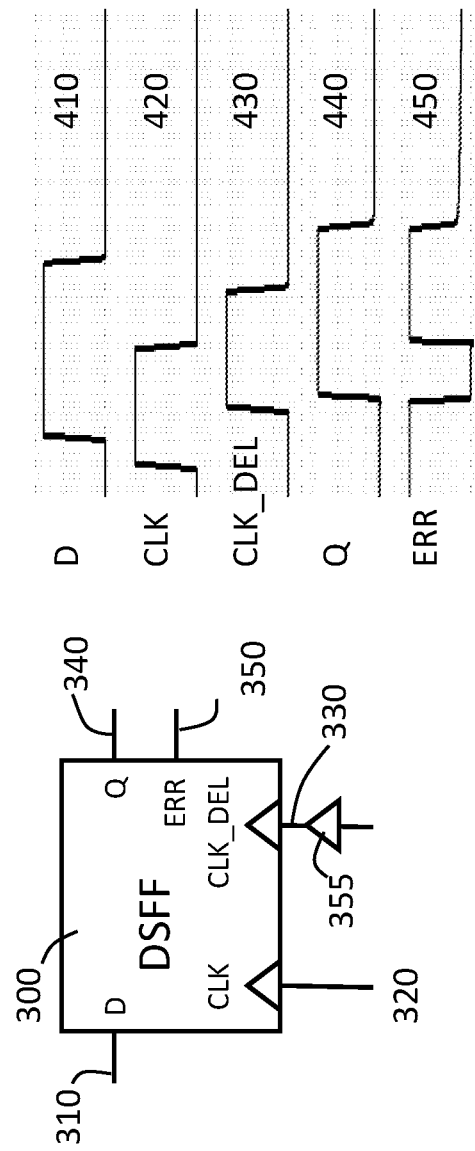
FIG. 3 shows an overview of the pins of a DSFF.
FIG. 4 is a timing diagram of a DSFF, for detecting a set-up timing error.

FIG. 3 shows the pins of a DSFF. In addition to the data input D 310, it has two clock inputs: the first is the normal clock input CLK 320, and the other is a delayed clock CLK_DEL 330. In this example, the delay is introduced by adding a buffer 355 in the clock line to the delayed clock input CLK-DEL. Note that this is one solution to generate the delayed clock but others are possible. In addition to the latched output Q 340, the DSFF has a second output ERR 350. Use of DSFFs instead of regular flip-flops allows the detection of set-up timing errors, and provides a flag on output ERR, when a set-up timing error is detected.

The method by which this is achieved is illustrated by the timing diagram shown in FIG. 4. FIG. 4 shows a data signal at 410, clock signal CLK at 420, delayed clock CLK_DEL at 430, Latch Q at 440 and error flag ERR at 450. In this case there is a set-up timing error, such that the data D has not settled prior to the rising edge of the clock signal CLK. Instead, the data D changes halfway between the rising edge of CLK and CLK_DEL. The flip-flop is able to register the new data on the latch output Q and also flags the ERR signal between the rising edge of CLK_DEL and the falling edge of CLK. Note that in this example the error signal is an active low error signal.

Note that the duration of the delay between the clock signal CLK and the delayed clock CLK_DEL defines the width of the checking window. In an extreme case, in which the data change is delayed by more than the offset between CLK and CLK_DEL, the timing error would not be detected. It will be appreciated that the size or width of the checking window may be adjusted. Adjustment is done by increasing the delay between the clock and the delayed clock. The size or width of the checking window determines the amount of variability in the data signal which the system can deal with.

Various types of double sampling flip-flops have been proposed, for instance by Ernst et. al. in "Razor: Circuit-Level Correction Of Timing Errors For Low-Power Operation," IEEE Micro, Volume 24, Issue 6, December 2004, pp. 10-20, and by M. Choudhury et. al. in "TIMBER: Time borrowing and error relaying for online timing error resilience", Proc. of the Conference on Design, Automation and Test in Europe, Dresden, Germany, March 2010, pp. 1554-1559.

It is known to mask or correct set-up timing errors, which have been detected by double sampling flip-flops or otherwise. Masking an error may include letting the error propagate to a next stage of the logic, which next stage has sufficient slack to absorb the error. Correcting an error may be done for instance, by clock stretching, as illustrated in FIG. 5.

Figure 5:
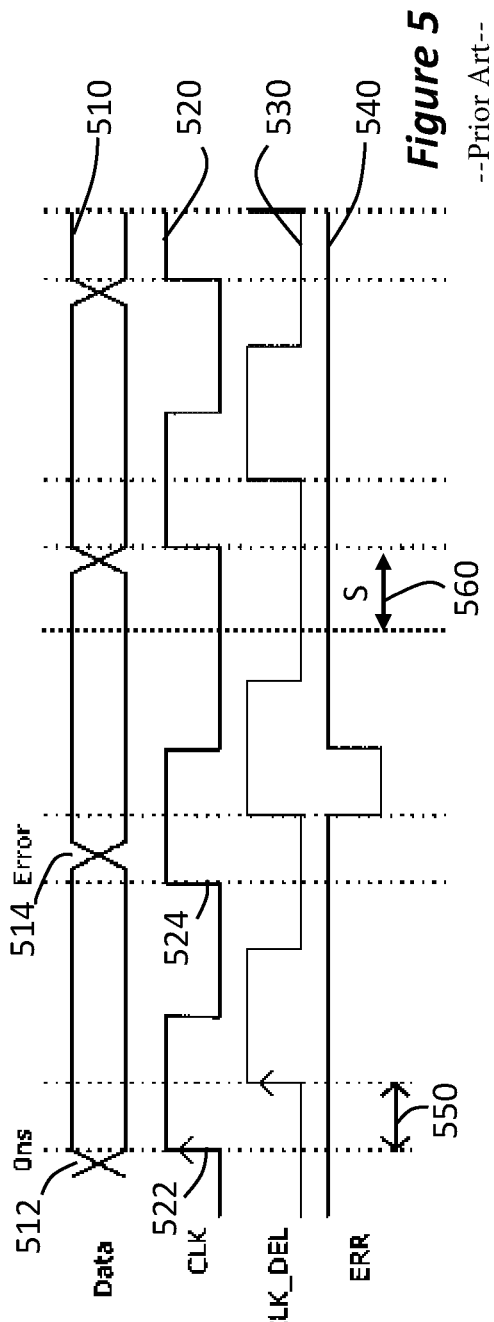
FIG. 5 shows a timing diagram of a typical path, illustrating detection and correction of a setup timing error.

FIG. 5 shows a data signal Data, 510, a clock signal CLK 520, a delayed clock CLK-DEL 530 and an active low error flag ERR 540. Note that in this figure, both high and low states of the data signal are shown: the crossover points mark moments of possible changes in the signal—irrespective of whether a transition actually occurs; it will be appreciated that a the "high-high" and "low-low" non-transitions are omitted for clarity. In this illustrative example, the delayed clock is delayed by one quarter of a clock period. The checking window 550 is thus equal to one quarter of a clock period. The checking window between the rising edge of CLK and CLK_DEL may be defined by including a buffer between the CLK and CLK_DEL, as shown in FIG. 3, or otherwise.

As shown in FIG. 5, the first data transition 512 does not have any timing error, that is to say it occurs ahead of the rising edge 522 of CLK 520. However, the subsequent data transition is subject to a timing error such that it occurs after the rising edge 524 of CLK 520. Thus the first sampling of the flip-flop does not register the data transition. However, the data transition 514 occurs ahead of, and is stable by the time of, the second, delayed, clock CLK_DEL. So the second sampling, which is triggered by the delayed clock, does register the transition, and the "correct" output may be latched (not shown). At the same time, the difference between the outputs from the first sampling and the second sampling triggers the ERR flag 540 to go active (i.e. low in this example).

In this specific example the error flag ERR is asserted only until the falling edge of the system clock, at which time it is reset. It will be recognised that in other examples the error flag may be latched until corrective action is completed.

Having identified the error, it may be corrected, for example as shown by clock stretching. The principle of clock stretching involves delaying a rising edge of the clock signal CLK, by a stretching interval S (shown at 560 in FIG. 5). Ideally, the stretching interval 560 is the same duration as the checking window. Since the CLK has been stretched by a duration which is at least as great as the timing-error offset then, absent another set-up timing error during this clock period, the logic in the next cell should have time to settle prior to the subsequent rising edge of the clock.

Other methods of correcting the error, once detected, will be known to the skilled person. For instance, a scheme such as clock gating may be used in which the clock is stopped for one complete cycle in order to give the data more time to arrive at the next flip-flop. In other examples, the error may be self-correcting, for instance where the next pipeline stage is relatively short, so the logic has time to settle in less than one complete clock period but within the shortened clock period between the rising edge of CLK_DEL and the subsequent rising edge of CLK.

Figure 6:
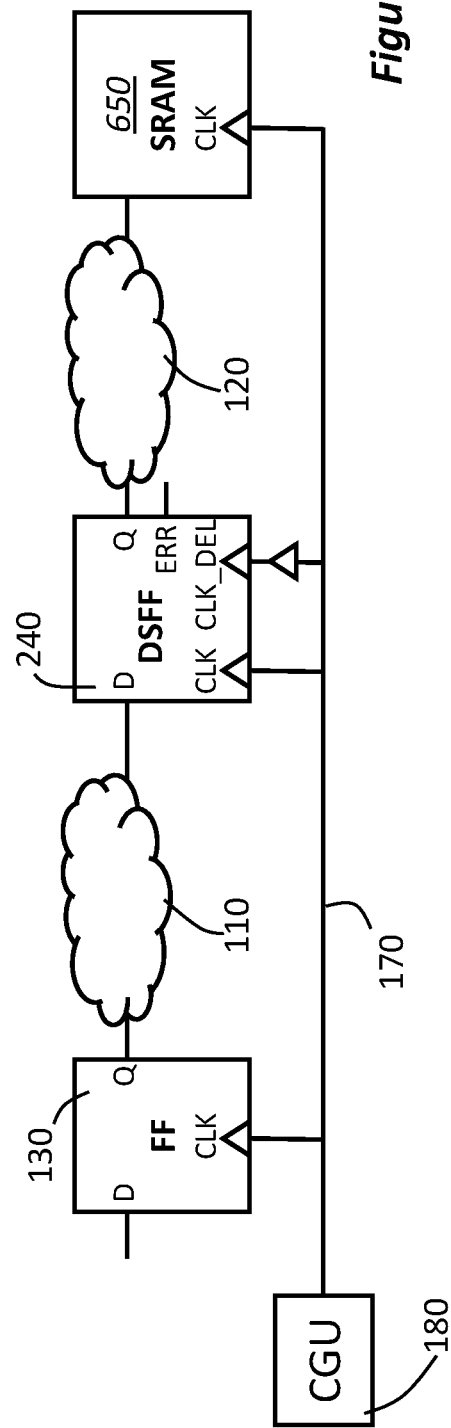
FIG. 6 shows a logic path leading to a hard macro.

A problem arises, when the data path includes a hard macro, such as an SRAM, or other hard core. An example such data path is shown in FIG. 6, which is similar to that shown in FIG. 2, except that the DSFF flip-flop 250 is replaced by a hard macro—in this case an SRAM 650. A macro, and more specifically a hard macro, may be considered as a 'black-box' which is not accessible and hence no extra double sampling flip-flops or other methods can be integrated in them. An example of a hard macro is memory, such as the SRAM shown in FIG. 6.

Now, in the stage connected to a hard macro (e.g. a memory) there is no possibility to borrow time. All timing errors must be both detected fixed before the data reaches the hard macro, that is to say, in the case of a memory, the correct signals have to go into the memory to ensure correct operation.

This problem may be overcome according to embodiments of the present disclosure, by including a detection and correction scheme upstream of and near to the hard macro. In effect, such an arrangement acts as a "macro monitor", to monitor the data and ensure it is error free as it reaches the macro.

Figure 7:
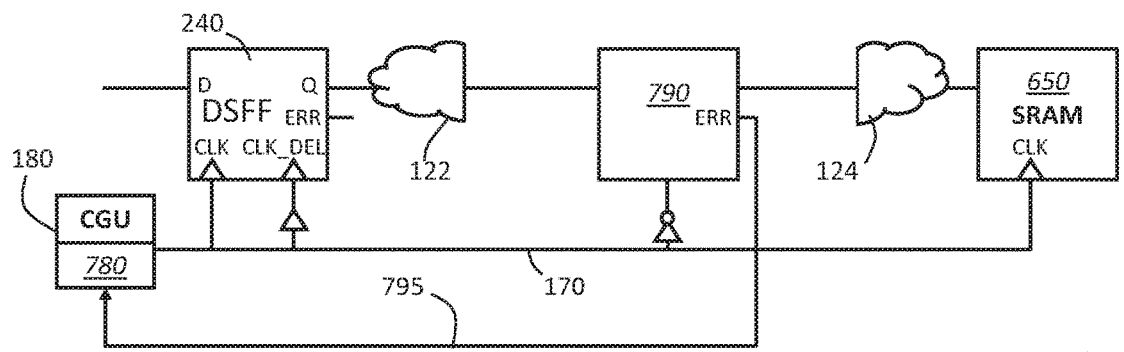
FIG. 7 shows a logic path leading to a hard macro, wherein the path includes a set-up error detector according to one or more embodiments.

Such an arrangement is shown in FIG. 7. The arrangement comprises a set-up timing error detector 790, positioned in the data path close to the macro. Specifically, as will be discussed in more detail below, the detector should be within one half clock period of the macro—to ensure that no setup timing errors are generated between the detector and the hard macro. It will be appreciated that a reference such "no more than one half clock period" refers to the time it takes for data to transit the respective logic block. If the logic block immediately upstream of the hard macro is more than half a clock period in duration, the logic block should be split, as shown, into two parts 122 and 124, with the detector 790 therebetween. The logic block second part 124 between the detector 790 and the hard macro is no more than one half clock period.

Furthermore, when a setup timing error is detected by the detector, it has to be corrected before it reaches the macro. The error correction may be done by means of clock gating or by using a clock stretcher which provides a fast, and less throughput-constraining, method of error correction. Thereto, the arrangement includes a feedback path 795 from the detector to a timing correction unit 780, which may use clock gating, clock stretching or other functionality to correct the error before it propagates to the hard macro. Thus a synchronous digital circuit according to the present disclosure may provide a way to accommodate timing changes in the design due to various sources (e.g. aging, voltage scaling, frequency scaling, etc.) by detecting timing errors and correcting them before the error reaches the hard macro, and thereby ensuring the correct value is input into the hard macro.

The detector may be closer to the macro than one half of a clock period; however, since it is required that any errors detected by the detector are also corrected by the time the signal reaches the macro, placing the detector closer to the macro imposes a tighter constraint on the operation of the timing correction unit. Moreover, since there needs to be a match between the data D which is latched and the clock, if the detector is placed closer to the macro than one half clock period, it may be more complicated to match the clock with the expected data value at that clock, as will be discussed further hereinbelow.

As shown in FIG. 7, the timing correction unit 780 may be part of the clock generation unit 180 to facilitate clock getting or clock stretching. In other embodiments, the timing correction unit utilises dynamic voltage scaling (not shown). In case dynamic voltage scaling is applied, the error signal can be fed to the power management unit of the system, where it provides an indication that the system or subsystem voltage needs to be increased to make the system faster. In other embodiments, the circuit may be used to determine a lowest safe operating voltage maintaining the same throughput: for example, the system may be run, and the voltage decreased stepwise until the detector starts to flag errors, which are corrected by the timing correction unit, thereby reducing the throughput. The operating voltage may then be increased, until no errors are flagged—consequently the throughput reverts to the original throughput. The voltage then is the lowest voltage at which the system can be run with the same throughput as for the nominal voltage. Power will be saved provided this lowest safe running voltage is lower than the nominal voltage.

Figure 8:
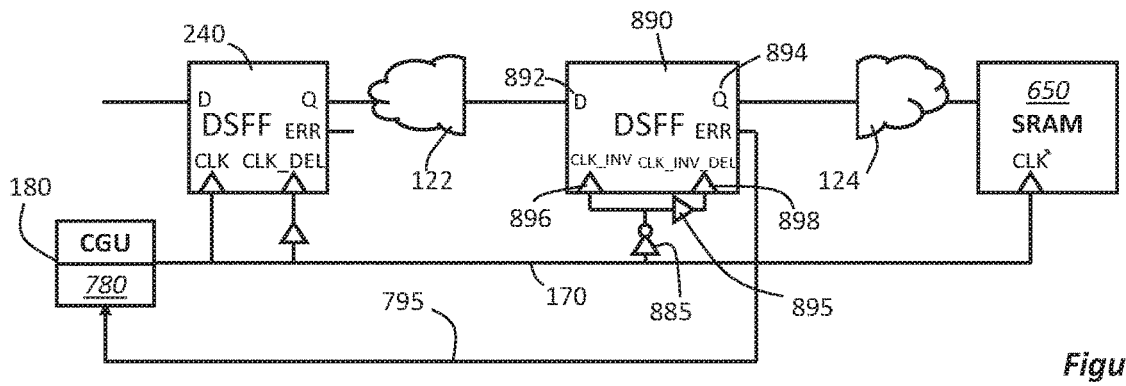
FIG. 8 shows a logic path leading to a hard macro, wherein the set-up error detector is in the form of a DSFF.

In one or more embodiments, the set-up timing detector 790 takes the form of a DSFF. This is shown in FIG. 8, in which a DSFF 890 is positioned in the data path, no more than one half-cycle upstream of the hard macro. The DSFF has a data input 892 from the upstream logic block first part 122, and a latched output Q 894 which acts as input to the downstream logic block second part 124 which is immediately upstream of the hard macro. The DSFF has a clock input 896 and a delayed clock input 898. The delay may be implemented by the inclusion of a buffer 895 between the clock and the delayed clock.

In the case that the DSFF is exactly one half of a clock period upstream of the hard macro, the DSFF clock is exactly one half period behind the main i.e. system clock generated by the CGU 180. That is to say, the DSFF clock is an inverted copy of the system clock. This is illustrated in FIG. 8 by the inverter 885. In the case that the DSFF is less than one half period upstream of the hard macro by an offset delta_t, the DSFF delayed clock CLK_DEL) is offset from an inverted system clock by an equivalent off-set delta_t. This may be done, for example, by increasing the buffer time of buffer 895, effectively increasing the checking window. However, the chances are then higher that the CLK_INV latches incorrect data. An alternative solution (not shown in FIG. 8) is to add a buffer before (or after) the inverter 885, effectively shifting the whole checking window. The skilled person will appreciate that other solutions may be possible, for example a delayed clock may be provided throughout the whole chip, resulting in two clock trees, one regular and one delayed—although this would likely result in of a lot of additional area requirement, and routing issues. Similarly, and again without limitation, an inverted clock may be provided throughout the whole chip.

As already mentioned, when an error is flagged the system should take corrective measures. This may be in the form of clock gating or something more elaborate such as clock stretching, but also may be in dynamic voltage scaling or adaptive body biasing, or other such techniques, in which adjustment of the system voltage leads to a change in clock period. Note that the corrective measures in this case have to be activated before the data reaches the hard macro which is within half a clock period of the detector. That is to say, it is necessary that the corrective action must be initiated prior to the data, which is potentially corrupted, reaching the hard macro. Of course, in embodiments in which the corrective measures involve "stopping the clock", by for instance clock stretching or clock gating, the corrective measures do not need necessarily to be completed before the end of a standard clock half-period (that is to say, half of a clock cycle of an un-altered free-running clock); however, it is required that the corrective measures are complete before the data reaches the hard macro—that is to say, within the remaining part of the clock cycle of the local clock, taking into account clock stretching or clock gating.

Figure 9:
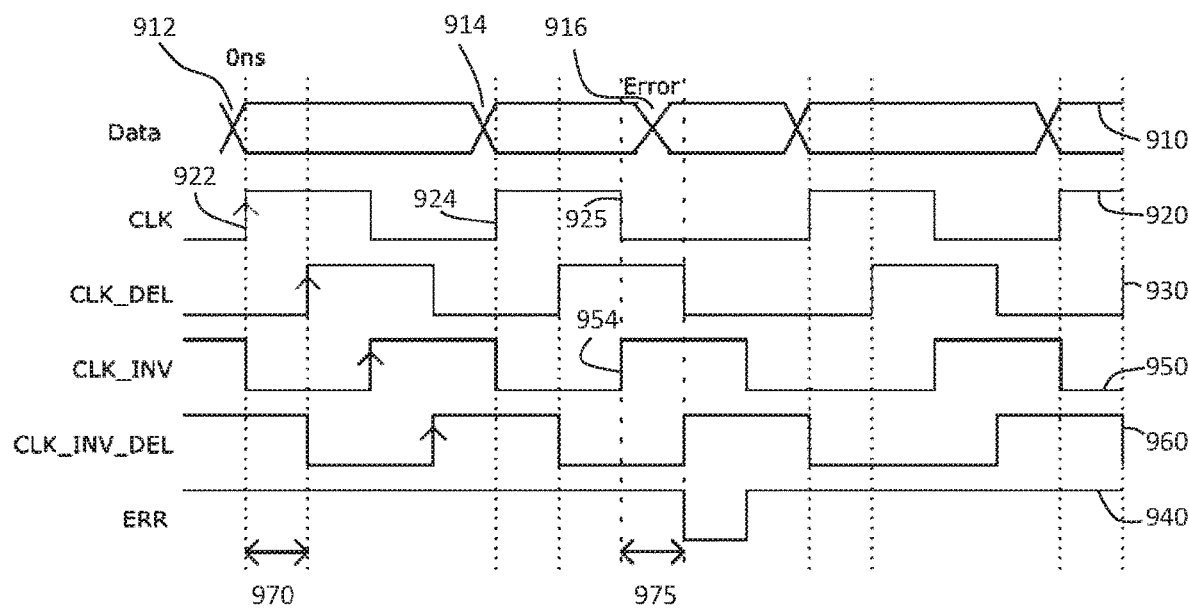
FIG. 9 is a timing diagram, showing detection of a set-up timing error, and correction, within a clock half period, according to embodiments of the disclosure.

FIG. 9 illustrates a method according to the present disclosure.

FIG. 9 depicts a data signal Data, 910 (showing both high and low states and, diagrammatically, the moments of possible transition), a clock signal CLK 920 and delayed clock CLK_DEL 930, similar to the conventional circuit of FIG. 5. The delayed clock is delayed by one quarter of a clock period. The checking window 970 is thus equal to one quarter of a clock period. As mentioned above, the checking window between the rising edge of CLK and CLK_DEL may be defined by including a buffer between the CLK and CLK_DEL, as shown in FIG. 3, or otherwise. However, this figure also incorporates a set-up timing error detector in the form of a DSFF having an inverted clock CLK_INV 950, and a delayed inverted clock CLK_INV_DEL 960, and an active low error flag ERR 940.

As shown in FIG. 9, the first two shown data transitions 912 and 914 do not have any timing error, that is to say they occur ahead of the rising edge 922 and 924 of CLK 920. (It should be noted that along with expected transition moments shown ahead of the rising edge of the clock CLK 922, there are other moments before each rising edge of the CLK_INV 950, related to the macro monitor). However, subsequent to the start of clock period indicated by rising edge 924, there is a timing error in the logic such that a transition 916 (which should occur before the half-cycle moment, occurs later than expected. That is to say it occurs after the falling edge 925 of CLK 920, rather than before it, and thus after the rising edge 954 of the inverted clock CLK_INV 950. Thus the first sampling of the set-up timing error flip-flop 890 does not register the data transition. However, the data transition 916 occurs ahead of, and is stable by the time of, the rising edge of the second, delayed clock, CLK_INV_DEL, after the checking window 975. So the second sampling, which is triggered by the delayed clock, does register the transition, and the "correct" output may be latched (not shown). At the same time, the difference between the outputs from the first sampling and the second sampling triggers the ERR flag 940 (i.e. it goes low in this example).

The system according to embodiments responds to this by applying a corrective measure, which in this example is done with the help of clock stretching. The clock stretcher delays the clock signal by a certain amount of time (in this case a quarter of the period), in order for the data to arrive on time.

Figures 10, 11:
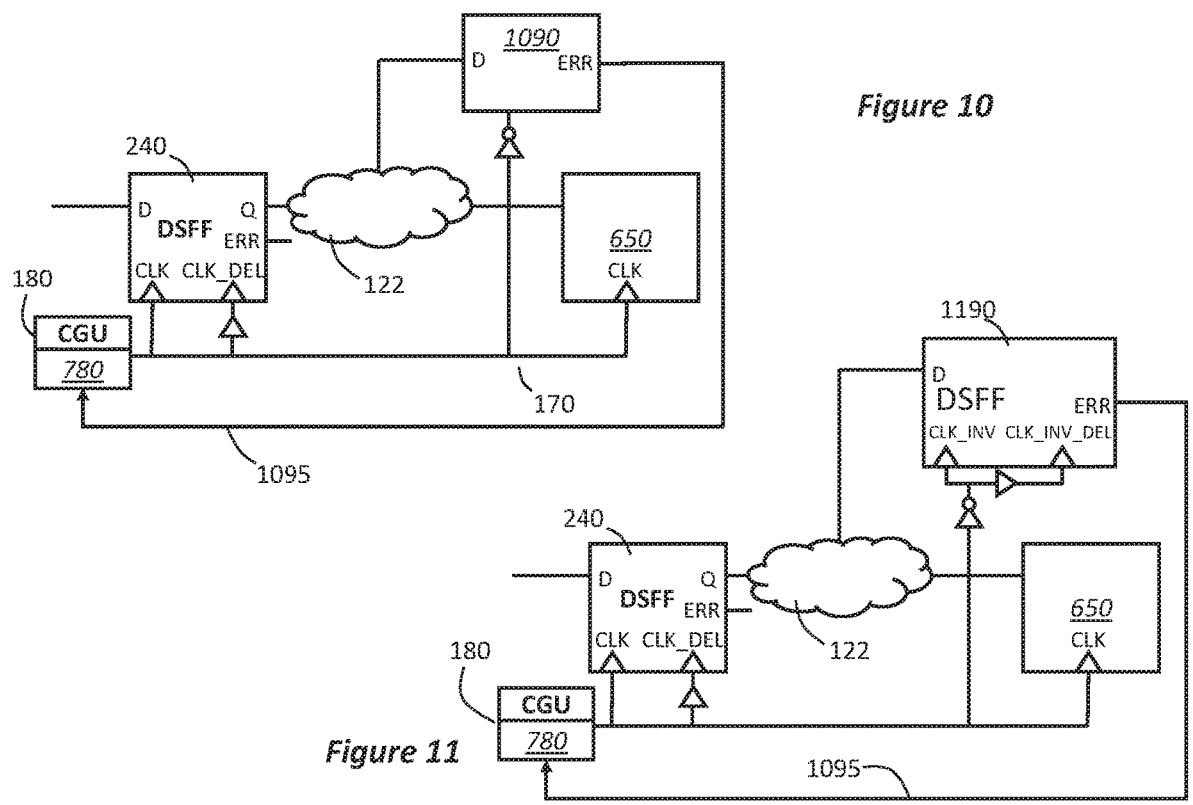
FIG. 10 shows a logic path leading to a hard macro, and including a set-up error detector which is not in the logic path, according to one or more embodiments.
FIG. 11 shows the logic path leading to a hard macro, wherein the detector is in the form of a DSFF.

Another embodiment according to the present disclosure is shown in FIG. 10. This embodiment is similar to that shown in FIG. 7, except that, in this case, the set-up timing error detector 1090 is not in the logic path. Rather, an input to the set-up timing error detector 1090 is provided from a point in the logic path which is equal to or less than one half of a clock period from the hard macro. Thus the logic does not need to be split into two separate parts: they may instead be contiguous or adjacent. The set-up timing error detector 1090, has an inverted clock input, and an error flag output ERR which provides an error feedback path 1095. The feedback path 1095 from the detector may be to a timing correction unit 780 forming part of the clock generation unit, similar to the embodiment shown in FIG. 7; alternatively and without limitation it may be fed to the power management unit of the system, where it may provide an indication that the system or sub-system voltage needs to be increased to make the system faster.

FIG. 11 shows another embodiment which is similar to that shown in FIG. 10, except that the set-up timing error detector be implemented as a DSFF 1190. Once again, the feedback path 1095 from the detector may be to a timing correction unit 780 forming part of the clock generation unit, as shown; alternatively and without limitation it may be fed to the power management unit of the system, where it may provide an indication that the system or sub-system voltage needs to be increased to make the system faster.

Figure 12:
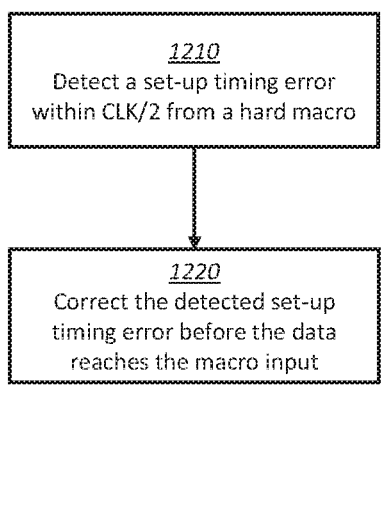
FIG. 12 shows a flow diagram of a method according to one or more embodiments.
Figure 13:
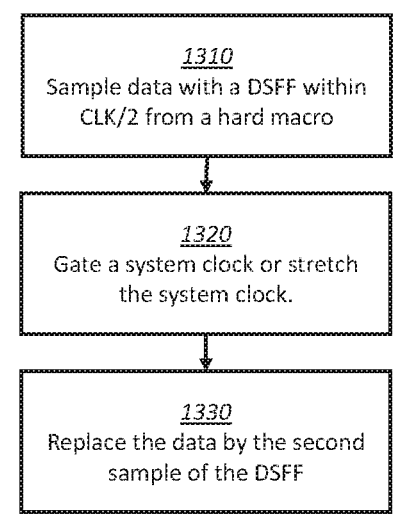
FIG. 13 shows a flow diagram of a method according to one or more other embodiments.

Methods according to embodiments are shown in FIGS. 12 and 13.

A method according to one of more embodiments is shown in FIG. 12. FIG. 12 depicts a flow diagram of a method a preventing set-up timing data errors in data propagating from logic to a hard macro, the logic and hard macro both comprised in a synchronous digital circuit. 1210 shows the step of detecting a set-up timing error, by means of a set-up timing error detector, within one half of a normal operation clock period prior to the data reaching the hard macro. And at step 1220 is shown correcting, in response to detecting a set-up timing error, the detected set-up timing error before the data reaches the macro input.

A method according to one of more other embodiments is shown in FIG. 13. 1310 shows the step of detecting a set-up timing error, by means of a set-up timing error detector, within one half of a normal operation clock period prior to the data reaching the hard macro. Correcting, in response to detecting a set-up timing error, the detected set-up timing error before the data reaches the macro input, comprises gating a system clock or stretching the system clock shown at 1320, and replacing the data by the second sample of the double sampling flip-flop, shown at 1330. In other embodiments, as discussed above, correction of the set-up timing data error is effected by means of voltage scaling or similar techniques.

Figure 14:
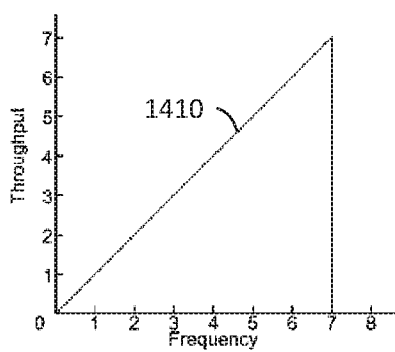
FIG. 14 shows a graph illustrating the performance of a circuit without set-up timing error detection and correction.
Figure 15:
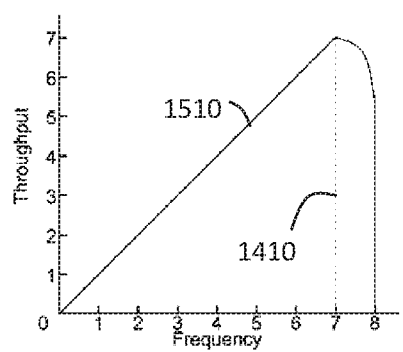
FIG. 15 shows a graph illustrating the performance of a circuit with set-up timing error detection and correction according to embodiments.

FIGS. 14 and 15 illustrate the performance of a synchronous digital circuit without and with set-up timing error detection and correction respectively, shown as terms of throughput (on the y-axis or ordinate), plotted against clock speed (on the x-axis or abscissa).

As shown in FIG. 14, absent setup-timing error detection and correction immediately upstream of a hard macro (i.e. 'macro monitoring') the frequency 1410 can be increased up until a point where timing requirements can no longer be met and at that point the system will fail. The illustrative figure shows that at frequency '7', the throughput of the system drops to zero because of incorrect latching of signals.

In contrast, in a system in which setup-timing error detection and correction immediately upstream of a hard macro, according to embodiments of the present disclosure, is implemented, the system will show a drop in throughput before failing. This behaviour is illustrated FIG. 15. The line 1410 shows the behaviour of a regular system without setup-timing error detection and correction immediately upstream of a hard macro (as per FIG. 14). The line 1510 shows the behaviour of a system according to embodiments of the present disclosure. Instead of failing at a frequency of '7', the frequency can be further increased. This is due to the fact that the 'macro monitoring' (i.e. setup-timing error detection and correction immediately upstream of a hard macro) grants the system more time by taking corrective measures when data to a hard macro starts to present timing issues. The throughput at that point drops since the macro monitor will flag an error and thus activate the corrective measures (such as clock stretching or the like), which will lower the performance but without incurring a system failure.

The detector may be implemented as a double sampling flip flop, as described above. However, the disclosure is not limited thereto, and the skilled person will readily appreciate that other implementation are possible. For example, the detector may be implementation as separate flip-flops where the inputs are tied. The clock to one is the regular clock and the clock to the second one is the delayed clock. The outputs go to an exclusive OR and this can flag the error.

Such a detector is illustrated in FIG. 16, which shows two flip-flops 1610 and 1620; the clock input to the second flip-flop 1620 is delayed by the inclusion of the buffer 1630, relative to the clock input to the first flip-flop 1610. The data inputs D are tied. The outputs are combined by XOR logic 1640, the output from which is the error flag ERR.

Another example of such a detector is shown in FIG. 17. In this example, a double sampling flip-flop (DSFF) 1710 is fully enclosed, as part of a cell 1720 which includes not only the DSFF but also a clock delay buffer 1730 such that it is necessary to provide only one clock from the outside. It will be appreciated that for such an embodiment, it may not be possible to change the delay and therefor the checking window.

From reading the present disclosure, other variations and modifications will be apparent to the skilled person. Such variations and modifications may involve equivalent and other features which are already known in the art of digital circuit design, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

LIST OF REFERENCE SIGNS

110 logic block
122 logic block first part
124 logic block second part
120 logic block
130, 140, 150 flip-flops
160 data signal
170 clock signal
180 clock generation unit
240, 250 double sampling flip-flops
310 data signal D
320 clock input CLK
330 delayed clock input CLK_DEL
340 lathed output Q
350 Error flag ERR
355 Buffer
410 data signal D
420 clock input CLK
430 delayed clock input CLK_DEL
440 lathed output Q
450 Error flag ERR
510 data signal D
512, 514 data transition
520 clock input CLK
522, 524 clock rising edge
530 delayed clock input CLK_DEL
540 lathed output Q
550 checking window
560 stretching interval S
650 SRAM
780 timing correction unit
790 set-up timing error detector 795 feedback path
885 inverter
890 double sampling flip-flop
892 data input D
894 latched output Q
896 clock input CLK
898 delayed clock input CLK_DEL
910 data signal D
912, 914, 916 data transitions
922, 924 clock rising edge
925 clock falling edge
920 clock input CLK
930 delayed clock input CLK_DEL
940 Error flag ERR
950 inverted clock input CLK_INV,
954 inverted clock rising edge
960 delayed inverted clock CLK_INV_DEL
970, 975 checking windows
1090 set-up timing error detector
1095 feedback path
1210, 1220 process step
1310, 1320, 1330 process step
1410 throughput without set-up timing error detection and correction
1510 throughput with set-up timing error detection and correction
1610, 1620 double sampling flip-flop
1630 buffer
1640 exclusive OR logic cell
1710 double sampling flip-flop
1720 enclosed double sampling flip-flop
1730 buffer

The invention claimed is:

1. A synchronous digital circuit having a system clock and for processing a data signal, wherein the digital circuit comprises:
a data path;
a hard macro having a macro input;
a logic circuit in the data path upstream of the macro input and having a first part and a second part, the second part being immediately upstream of the macro input;
a set-up timing error detector having an input, wherein the input is coupled to the data path between the first part and the second part,
and a timing correction unit;
wherein during normal operation a data transit time across the second part is equal to or less than one half of a clock period, and
wherein the timing correction unit is configured to correct, in response to the set-up timing error detector detecting a set-up timing error in data propagating from the logic circuit to the hard macro, the detected set-up timing error before the data reaches the macro input.

2. The synchronous digital circuit according to claim 1, wherein the set-up timing error detector is in the data path and between the first part of the logic circuit and the second part of the logic circuit.

3. The synchronous digital circuit according to claim 2, wherein the set-up timing error detector comprises a flag configured to flag the set-up timing error to the timing correction unit.

4. The synchronous digital circuit according to claim 2, wherein the timing error detector comprises a double sampling flip-flop having a clock input which is an inverted system clock.

5. The synchronous digital circuit according to claim 4 wherein the double sampling flip-flop further comprises a delayed clock input which is a delayed inverted system clock.

6. The synchronous digital circuit according to claim 1, wherein the set-up timing detector is not in a logic path of the data path, and in the data path the first part of the logic circuit is adjacent the second part of the logic circuit in the data path.

7. The synchronous digital circuit as claimed in claim 1, wherein the timing correction unit comprises a clock gating unit configured to gate the system clock in response to detection of the set-up timing error.

8. The synchronous digital circuit as claimed in of claim 1, wherein the timing correction unit comprises a clock stretcher configured to stretch the clock in response to detection of the set-up timing error.

9. The synchronous digital circuit as claimed in claim 1, wherein the timing correction unit comprises one of (a) a voltage adjustment unit configured to adjust a voltage of the synchronous digital circuit, so as to speed up the clock, and (b) a body biasing adjustment circuit configures to adapt a bias of a body of the synchronous digital circuit, in response to detection of the set-up timing error.

10. The synchronous digital circuit as claimed in claim 1 wherein the hard macro is an SRAM.

11. An electronic component comprising the synchronous digital circuit as claimed in claim 1.

12. A method of preventing set-up timing data errors in data propagating from logic to a hard macro, the logic and hard macro both comprised in a synchronous digital circuit, the method comprising:
detecting a set-up timing error, by means of a set-up timing error detector, within one half of a normal operation clock period prior to the data reaching the hard macro,
and correcting, in response to detecting a set-up timing error, the detected set-up timing error before the data reaches a macro input of the hard macro.

13. The method of claim 12, wherein detecting the set-up timing error comprises double sampling the data by a double sampling flip-flop.

14. The method of claim 13, wherein correcting the detected set-up timing error comprises gating a system clock or stretching the system clock, and replacing the data by the second sample of the double sampling flip-flop.

15. The method of claim 13, wherein correcting the detected set-up timing error comprises adjusting an operating voltage of the synchronous digital circuit, and replacing the data by the second sample of the double sampling flip-flop.

* * * * *